(12) United States Patent
Kulick et al.

(10) Patent No.: US 10,182,498 B2
(45) Date of Patent: Jan. 15, 2019

(54) SUBSTRATES WITH INTERDIGITATED HINGED EDGE INTERCONNECTS

(71) Applicant: Indiana Integrated Circuits, LLC, South Bend, IN (US)

(72) Inventors: Jason M. Kulick, South Bend, IN (US); Tian Lu, Osceola, IN (US)

(73) Assignee: Indiana Integrated Circuits, LLC, South Bend, IN (US)

( * ) Notice: Subject to any disclaimer, the term of this patent is extended or adjusted under 35 U.S.C. 154(b) by 0 days.

(21) Appl. No.: 15/295,257

(22) Filed: Oct. 17, 2016

(65) Prior Publication Data

US 2017/0127518 A1    May 4, 2017

Related U.S. Application Data

(60) Provisional application No. 62/247,477, filed on Oct. 28, 2015, provisional application No. 62/247,457, filed on Oct. 28, 2015, provisional application No. 62/247,439, filed on Oct. 28, 2015.

(51) Int. Cl.
*H05K 1/14*    (2006.01)
*H01L 23/538*    (2006.01)

(52) U.S. Cl.
CPC ......... *H05K 1/148* (2013.01); *H01L 23/5385* (2013.01)

(58) Field of Classification Search
CPC ...... H05K 1/118; H05K 1/0393; H05K 1/028; H05K 1/14; H05K 1/141–1/148; H01L 23/13; H01L 23/544

USPC ....... 361/749, 767, 775, 777, 778, 784, 803; 174/254–262
See application file for complete search history.

(56) References Cited

U.S. PATENT DOCUMENTS

| | | | |
|---|---|---|---|
| 6,768,195 B2 * | 7/2004 | Drost | H01L 23/544 257/686 |
| 7,612,443 B1 | 11/2009 | Bernstein et al. | |
| 9,620,473 B1 * | 4/2017 | Hall | H01L 25/167 |
| 2001/0053565 A1 * | 12/2001 | Khoury | H01L 23/13 438/121 |
| 2008/0017971 A1 | 1/2008 | Hollis | |
| 2009/0085183 A1 | 4/2009 | Mitchell et al. | |
| 2010/0059897 A1 | 3/2010 | Fay et al. | |
| 2011/0227200 A1 * | 9/2011 | Chow | H01L 23/544 257/618 |
| 2011/0299255 A1 * | 12/2011 | Nakanishi | H01L 23/13 361/749 |
| 2013/0105984 A1 * | 5/2013 | Rathburn | H01R 12/7076 257/773 |
| 2017/0162532 A1 | 6/2017 | Kulick et al. | |

* cited by examiner

*Primary Examiner* — Tuan T Dinh
(74) *Attorney, Agent, or Firm* — The Webb Law Firm

(57) ABSTRACT

A quilt packaging system includes a first microchip substrate having a first edge surface which includes a first conductive interconnecting structure disposed thereon and a second microchip substrate having a first edge surface which includes a second conductive interconnecting structure disposed thereon. The first conductive interconnecting structure is hingedly connected in an interdigitated manner with the second conductive interconnecting structure at an angle that is not a straight angle.

9 Claims, 5 Drawing Sheets

SUBSTRATES WITH INTERDIGITATED HINGED EDGE INTERCONNECTS

CROSS REFERENCE TO RELATED APPLICATIONS

This application claims the benefit of U.S. Provisional Patent Application Nos. 62/247,439; 62/247,457; and 62/247,477, all of which were filed on Oct. 28, 2015, and all of which are incorporated herein by reference in their entirety.

BACKGROUND OF THE INVENTION

Field of the Invention

The present application relates generally to microchips, microchip packaging and the interconnection of microchips.

Description of Related Art

Affordable electronic systems having increased functionality and smaller packaging have been in demand for many years. Significant advances in microchip packaging and system design, including Quilt Packaging of microchips, have resulted from such demand. The process of forming interconnect nodules on the surface, or protruding laterally from the surface, of microchips is known generally in the art. One example of such technology is illustrated by U.S. Pat. No. 7,612,443, which is incorporated herein by reference.

As microchips are being formed, etching, metal plating, photolithography and other processes using gold, silver, copper or other metals allow for the formation of solid metal contacts (nodules) along the vertical edges of microchips. In an example of forming microchips that include interconnect nodules, also called Quilt Package or QP nodules herein, semiconductor wafers contain multiple microchips with each microchip separated from its neighboring microchips on the wafer by "streets." Trenches are etched in the street regions and are passivated by forming one or more layers on the exposed surfaces of the trenches using techniques known in the art. Passivation techniques can include PECVD nitride, PECVD oxide, sputtered oxide, and low-k dielectrics or other dielectric materials. A resist coating is then applied to the wafer and subsequently removed from the trenches to form openings in the resist coating over the trenches. Metal is deposited into trenches through the openings in the resist. After the resist is removed, a plating process then is applied to the metal to form metal interconnect or QP nodules. The interconnect or QP nodules are further processed, including a chemical-mechanical polishing step, the addition of dielectric material, and the formation of on-chip electrical connections. Interconnect or QP nodules can also be formed to protrude over the edge of the microchip by performing an anisotropic etch followed by an isotropic etch causing vertical surfaces of the wafer to recede, allowing the interconnect or QP nodules to protrude beyond the edges of the microchip. For additional details regarding forming interconnect or QP nodules, see U.S. Pat. No. 7,612,443.

Wafer processing using these known techniques allows microchips to be manufactured and placed side by side with electrical interconnection directly through the interconnect or QP nodules without having to go through first level packaging to printed circuit boards or multi-chip modules. This process of directly connecting chips to form a quilt-like pattern is known in the art as Quilt Packaging. Nodules that protrude over the edge of the microchip (also known as edge interconnection nodules or Quilt Package (QP) nodules) further allow for increased integration of system components without sacrificing performance or increasing cost. This technology allows for not only inter-chip communication, but also mechanical fastening and alignment. Multiple chips or components can be fabricated with dissimilar technologies or substrate materials and interconnected into a monolithic-like structure. Due to the nature of the manufacturing process, the geometry of the nodules and chip/component substrate are lithographically-defined, which allows for the application-specific definition of chip-to-chip gap and alignment, in addition to overall package-level system architecture. It is desirable to use Quilt Packaging in ways not disclosed in the prior art to further increase these benefits.

SUMMARY OF THE INVENTION

Various preferred and non-limiting examples will now be described as set forth in the following numbered clauses:

Clause 1: A quilt packaging system comprises a first microchip substrate having a first edge surface which includes a first interconnecting structure disposed thereon and a second microchip substrate having a first edge surface which includes a second interconnecting structure disposed thereon. The first interconnecting structure is hingedly connected in an interdigitated manner with the second interconnecting structure.

Clause 2: The quilt packaging system of clause 1, wherein the first interconnecting structure can comprise a quilt package nodule that protrudes beyond the first edge surface of the first microchip substrate; and the second interconnecting structure can comprise a quilt package nodule that protrudes beyond the first edge surface of the second microchip substrate. The quilt package nodule on the first edge surface of the first microchip substrate can be in physical contact in an interdigitated manner with the quilt package nodule on the first edge surface of the second microchip substrate.

Clause 3: The quilt packaging system of clause 1 or 2, wherein the quilt package nodules on the first edge surface of the first microchip substrate and on the first edge surface of the second microchip substrate can be formed from conducting material.

Clause 4: The quilt packaging system of any of clauses 1-3, wherein the conducting material can be a metal.

Clause 5: The quilt packaging system of any of clauses 1-4, wherein the metal can be copper.

Clause 6: The quilt packaging system of any of clauses 1-5, wherein the quilt package nodule on the first edge surface of the first microchip substrate can be soldered to the quilt package nodule on the first edge surface of second microchip substrate.

Clause 7: The quilt packaging system of any of clauses 1-6, wherein the quilt package nodule on the first edge surface of the first microchip substrate and the quilt package nodule on the first edge surface of the second microchip substrate can be connected together via mechanical friction fit.

Clause 8: The quilt packaging system of any of clauses 1-7, wherein a plurality of microchip substrates can be hingedly connected via interconnecting structures in an interdigitated manner to form a non-planar assembly.

Clause 9: The quilt packaging system of any of clauses 1-8, wherein each quilt package nodule can include a back supported by the corresponding microchip substrate and one or more fingers that extend away from said back and away from the corresponding edge surface of the microchip substrate.

Clause 10: A quilt packaging system comprises a first microchip substrate having a first edge surface that includes a first interconnecting structure and a second microchip substrate having a first edge surface that includes a second interconnecting structure. The first interconnecting structure is hingedly connected in an interdigitated manner with the second interconnecting structure. The first interconnecting structure comprises a first quilt package nodule recessed in the first edge surface of the first microchip substrate and the second interconnecting structure comprises a second quilt package nodule recessed in the first edge surface of the second microchip substrate. The first quilt package nodule is in physical contact in an interdigitated manner with the second quilt package nodule.

Clause 11. The quilt packaging system of clause 10, wherein a plurality of microchip substrates can be hingedly connected via quilt package nodules of the plurality of microchip substrates in an interdigitated manner to form a non-planar structure.

Clause 12. The quilt packaging system of clause 10 or 11, wherein each quilt package nodule can include a back supported by the corresponding microchip substrate and one or more fingers that extend away from said back and away from the corresponding edge surface of the microchip substrate.

DETAILED DESCRIPTION OF THE INVENTION

The following examples will be described with reference to the accompanying figures, where like reference numbers correspond to like or functionally equivalent elements. Persons of ordinary skill in the art will realize that the following examples are illustrative only and not in any way limiting. Other examples will readily suggest themselves to such skilled persons.

Figure 1A:
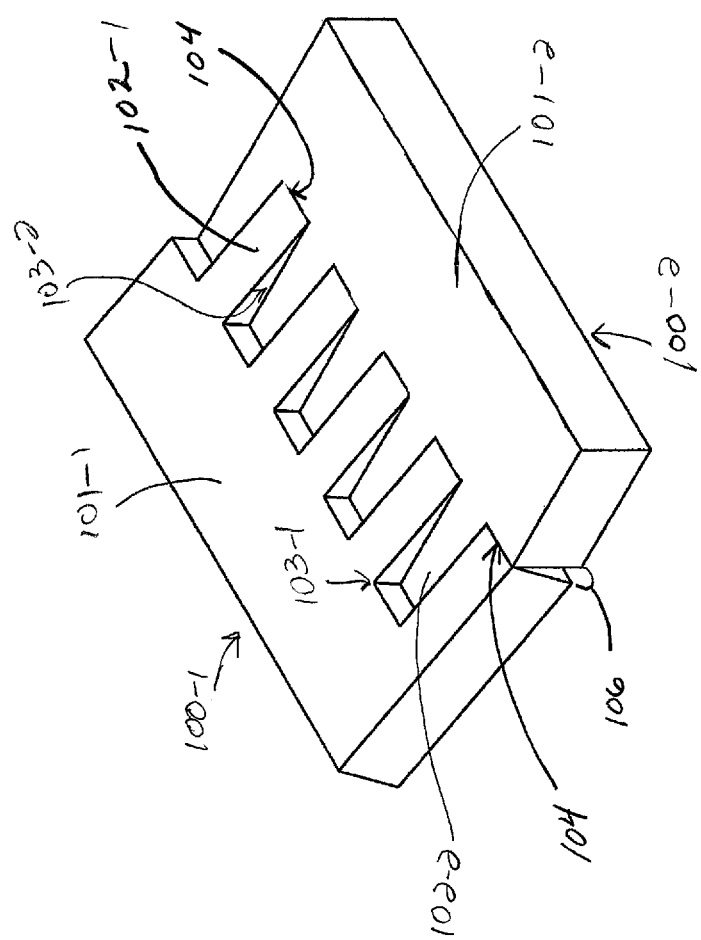
FIG. 1A is a plan view of two QP nodules with interdigitated hinged edge interconnects.
Figure 1B:
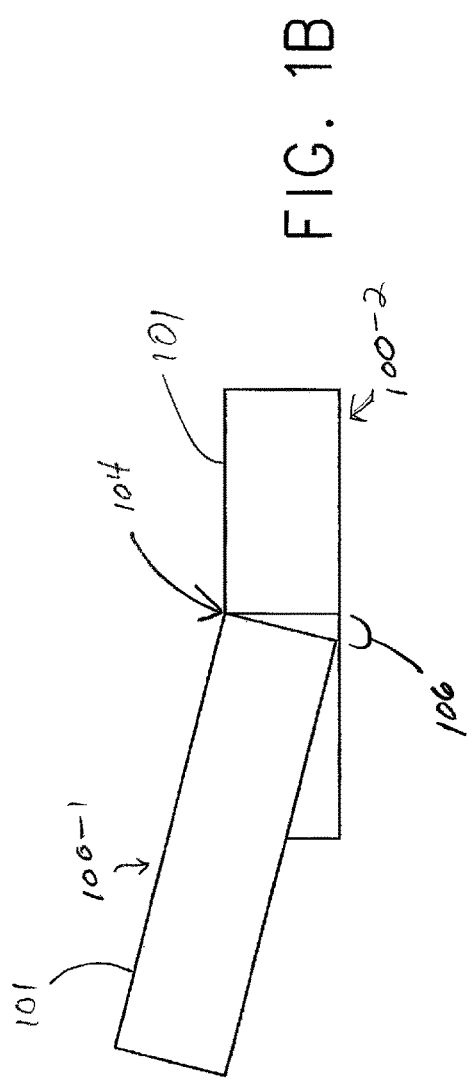
FIG. 1B is a side view of FIG. 1A.
Figure 1C:
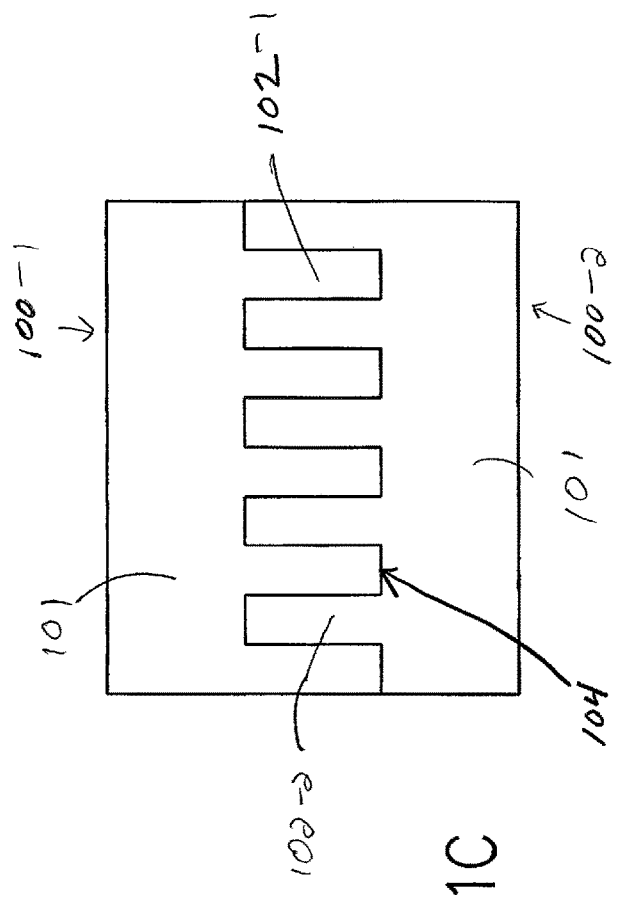
FIG. 1C is a top view of FIG. 1A.

FIGS. 1A-1C show plan, side and top views of a pair of interconnecting structures in the form of quilt package (QP) nodules 100-1 and 100-2 each having a plurality of fingers 102-1 and 102-2, respectively connected in an interdigitated manner to form a plurality of hinges 104 at angles 106. Fingers 102-1 extend from a back 101-1 of QP nodule 100-1. Similarly, fingers 102-2 extend from a back 101-2 of QP nodule 100-2.

QP nodules 100-1 and 100-2 can be used to provide electrical connections and/or as interconnecting structures to provide mechanical stability between microchips, substrates or other components. QP nodules 100-1 and 102-2 and the method of making QP nodules is known in the art and will not be further described herein for simplicity (see e.g., U.S. Pat. No. 7,612,443, where the QP nodules described herein are referred to as "interconnect nodules").

Fingers 102-1 and 102-2 can be of any number, size or geometry, and the interdigitated fingers on adjoining QP nodules can be of different lengths. Hinges 104 can be formed at the distal ends of fingers 102 as shown in FIGS. 1A-1C or can be located anywhere along the length of the interdigitated fingers 102-1 and 102-2 where there is a mechanical friction fit between interdigitated fingers 102. In the example shown in FIGS. 1A-1C, the distal ends of four fingers 102-1 are positioned at or adjacent proximal ends of slots 103-2 between adjacent pairs of fingers 102-2 of QP nodule 100-2. Similarly, the distal ends of four fingers 102-2 are positioned at or adjacent the proximal ends of slots 103-1 formed between adjacent pairs of fingers 102-1 of QP nodule 100-1. In the example shown in FIG. 1C, the rightmost finger 102-2 of QP nodule 100-1 abuts only one side of the adjacent finger 102-1 of QP nodule 100-1. Similarly, the leftmost finger 102-1 of QP nodule 100-1 only abuts only one side of the adjacent finger 102-2 of QP nodule 100-2. In the example shown in FIGS. 1A-1C, each QP nodule 100-1 and 100-2 has the same number of fingers 102. However, this is not to be construed in a limiting sense since it is envisioned that each QP nodule 100 can have any number of fingers. For example, QP nodule 100-1 can have X number of fingers (where X is greater than or equal to 2) and QP nodule 100-2 can have X+2 number of fingers, whereupon all of the fingers of QP nodule 100-1 can be positioned between adjacent pairs of fingers of QP nodules 100-2. However, this is not to be construed in a limiting sense. Angles 106 can be acute, obtuse, right or straight to accommodate customized assemblies of microchips, substrates or other components having QP nodules of any size and/or geometry, including planar, non-planar, hemispherical or curved geometries. A variety of methods can be used to connect QP nodules including pushing them together along a horizontal or angled plane, sliding them together vertically from above or below, or any number of other mechanical methods. The illustration and discussion of various sizes, shapes, geometries, angles and connection methods herein is not to be construed as limiting since it is envisioned that any number of custom assembly configurations are possible.

Figure 2:
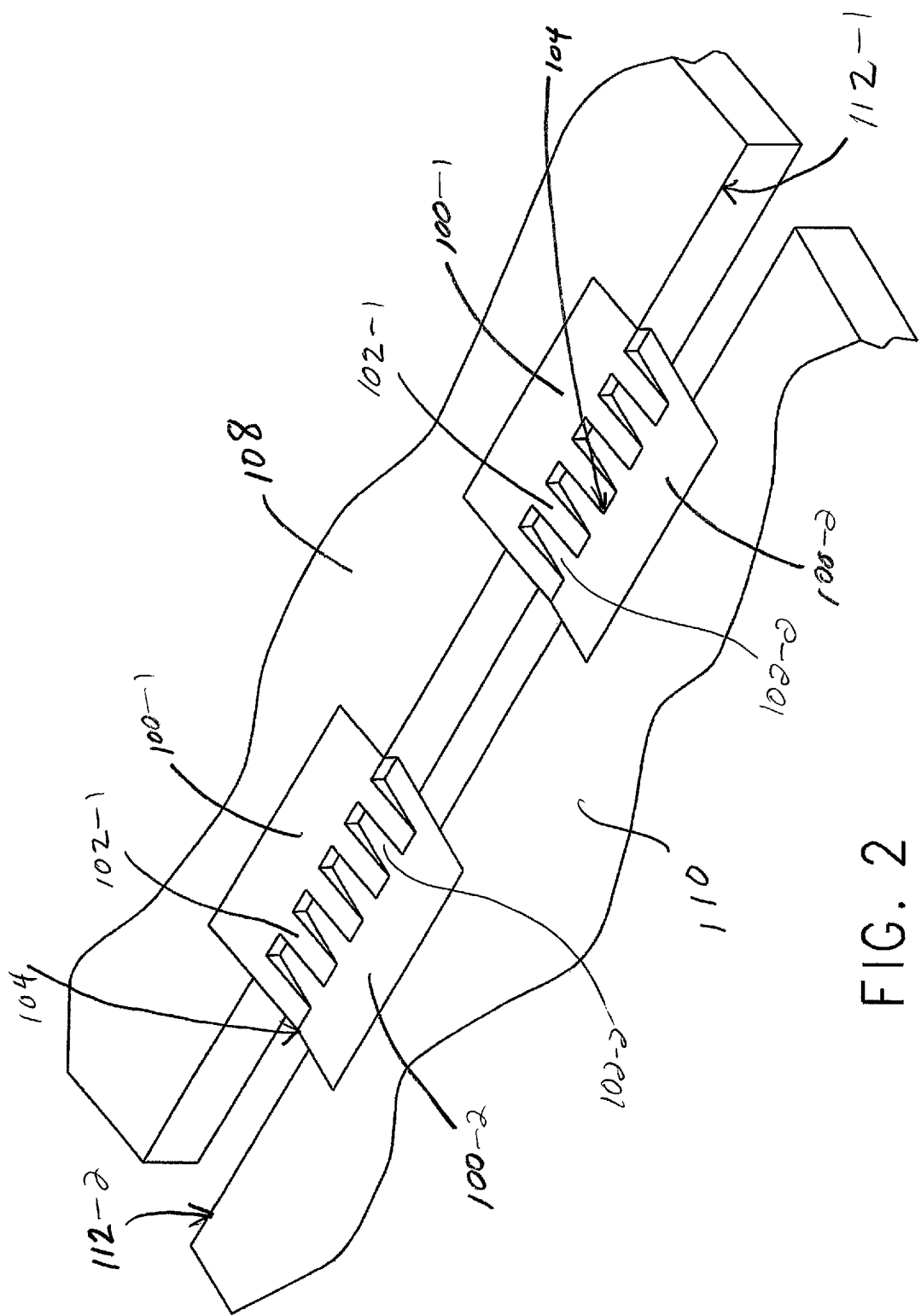
FIG. 2 is a plan view of two substrates with QP nodules having interdigitated hinged edge interconnects.

Referring now to FIG. 2, first microchip substrate 108 and second microchip substrate 110 are shown, having respective QP nodules 100-1 and 100-2 disposed on edge surfaces 112-1 and 112-2. First microchip substrate 108 is connected to second microchip substrate 110 with each having QP nodules 100-1 and 100-2 including subsets of the fingers 102-1 and 102-2 thereof connected in an interdigitated manner forming hinges 104. The fingers 102-1 and 102-2 of QP nodules 100-1 and 100-2 on both first microchip substrate 108 and second microchip substrate 110, respectively, are shown extending beyond edge surfaces 112-1 and 112-2. However, QP nodules 100-1 and/or 100-2 and fingers 102-1 and/or 102-2 can be recessed into the substrate.

Each finger 102 can be of any length to customize the gap between microchip substrates as well as to provide a desired angle of pivot for hinges 104. QP nodules 100-1 and 100-2 on respective first microchip substrate 108 and second microchip substrate 110 can have subsets of the fingers 102-1 and 102-2 thereof connected or coupled together to create the desired mechanical and/or electrical connection. In an example, the desired mechanical or electrical connection can be made by mechanical friction fit and/or a solder reflow process. However, this is not to be construed in a limiting sense since it is envisioned that any suitable and/or desirable mechanical and/or electrical connection methodology can be utilized.

Figure 3:
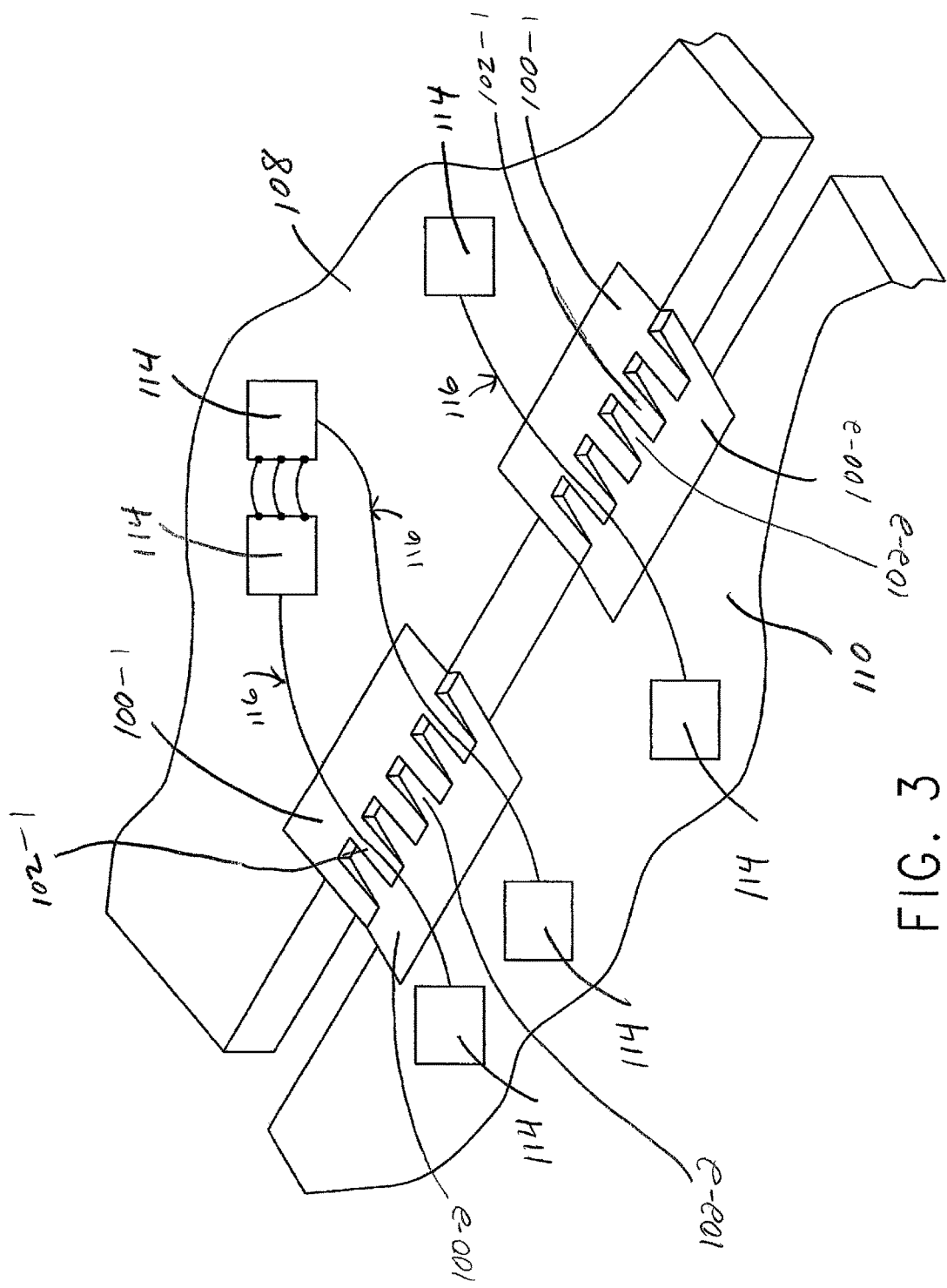
FIG. 3 is a plan view of electrically connected integrated circuits on the two substrates of FIG. 2.

With reference to FIG. 3, in another example, circuit elements 114 are shown on first microchip substrate 108 and second microchip substrate 110. Circuit elements 114 can be power integrated circuits, active or passive semiconductors, or circuits, optical components, or other type of circuit element. First microchip substrate 108 is connected to second microchip substrate 110 via QP nodules 100-1 and fingers 102-1 connected in an interdigitated manner forming hinges 104 with QP nodules 100-2 and fingers 102-2. Electrical leads 116 connect circuit elements 114 and can provide electrical connection of circuit elements 114 located on first microchip substrate 108 and second microchip substrate 110 through QP nodules 100-1 and 100-2, one or more fingers 102-1, and/or one or more fingers 102-2. The illustration and discussion of a number and type of circuit elements 114 and electrical leads 116 is not to be construed as limiting since it is envisioned that any number of custom configurations of circuit elements 114 and electrical leads 116 are possible.

Figure 4:
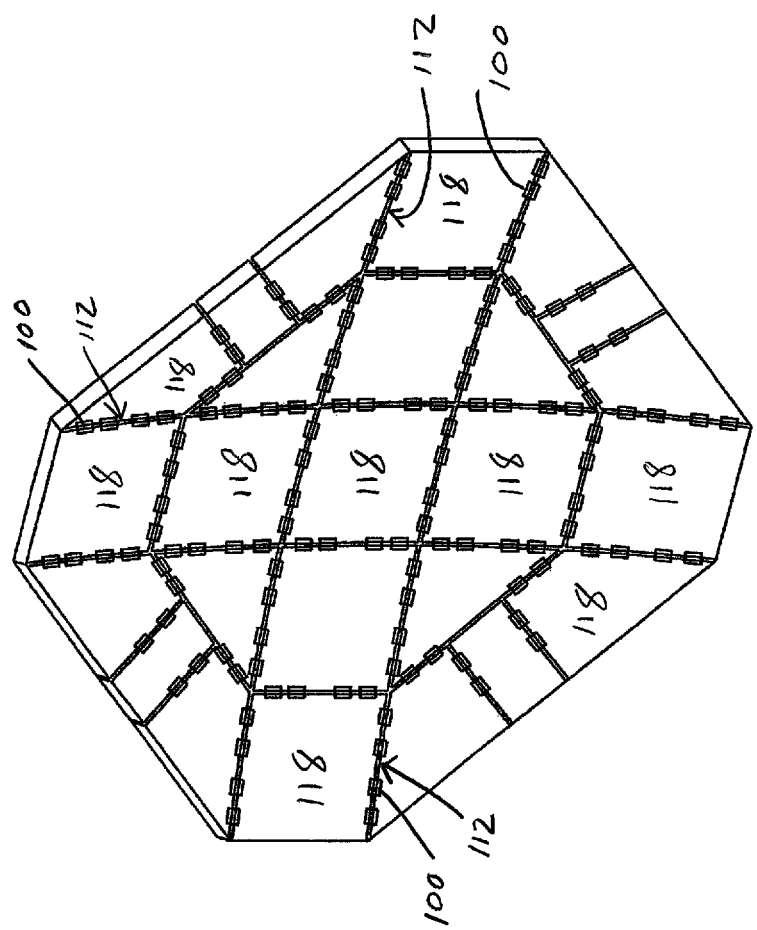
FIG. 4 is a plan view of a curved assembly of multiple substrates with QP nodules having interdigitated hinged edge interconnects.

With reference to FIG. 4, in another example, a plurality of microchip substrates 118 each having each having QP nodules 100 disposed on edge surfaces 112 with subsets of fingers of nodules 100 fingers 102 connected in an interdigitated manner can be used to form a non-planar shaped assembly 120. Although rectangles, triangles, squares and trapezoids are shown, individual microchip substrates 118 can be of any suitable and/or desirable size or shape to accommodate the shape of assembly 120. Although hinges and angles between pairs of microchip substrates, similar to those depicted in FIGS. 2-3, are not specifically shown, microchips 118 are hingedly interconnected with varying angles and gaps between microchip substrates to accommodate the desired shape of assembly 120. Any number of circuit elements (not shown) can be located on microchips 118 to accommodate a desired functionality.

The examples have been described with reference to the accompanying figures. Modifications and alterations will occur to others upon reading and understanding the foregoing examples. Accordingly, the foregoing examples are not to be construed as limiting the disclosure.

The invention claimed is:

1. A quilt packaging system comprising:
    a first microchip substrate having a first edge surface which includes a first conductive interconnecting structure formed thereon using wafer processing techniques; and
    a second microchip substrate having a first edge surface which includes a second conductive interconnecting structure formed thereon using wafer processing techniques;
    wherein the first conductive interconnecting structure is hingedly connected in an interdigitated manner with the second conductive interconnecting structure at an angle that is not a straight angle, wherein the first conductive interconnecting structure comprises a quilt package nodule that protrudes beyond the first edge surface of the first microchip substrate; and
    the second conductive interconnecting structure comprises a quilt package nodule that protrudes beyond the first edge surface of the second microchip substrate;
    wherein the quilt package nodule on the first edge surface of the first microchip substrate is in physical contact in the interdigitated manner with the quilt package nodule on the first edge surface of the second microchip substrate; and
    each quilt package nodule includes a back supported by the corresponding microchip substrate and one or more fingers that extend away from said back and away from the corresponding edge surface of the microchip substrate.

2. The quilt packaging system of claim 1 wherein the quilt package nodules on the first edge surface of the first microchip substrate and on the first edge surface of the second microchip substrate are formed from a conducting material.

3. The quilt packaging system of claim 1 wherein the quilt package nodule on the first edge surface of the first microchip substrate and the quilt package nodule on the first edge surface of the second microchip substrate are connected together via mechanical friction fit.

4. The quilt packaging system of claim 1, wherein the angle is acute, obtuse, or right.

5. The quilt packaging system of claim 2 wherein the conducting material is a metal.

6. The quilt packaging system of claim 5 wherein the metal is copper.

7. The quilt packaging system of claim 6 wherein the quilt package nodule on the first edge surface of the first microchip substrate is soldered to the quilt package nodule on the first edge surface of second microchip substrate.

8. A quilt packaging system comprising:
    a first microchip substrate having a first edge surface that includes a first conductive interconnecting structure formed on the first microchip using wafer processing techniques; and
    a second microchip substrate having a first edge surface that includes a second conductive interconnecting structure formed on the second microchip using wafer processing techniques;
    wherein the first conductive interconnecting structure is hingedly connected in an interdigitated manner with the second conductive interconnecting structure at an angle that is not a straight angle wherein:
    the first conductive interconnecting structure comprises a first quilt package nodule recessed in the first edge surface of the first microchip substrate; and
    the second conductive interconnecting structure comprises a second quilt package nodule recessed in the first edge surface of the second microchip substrate; and
    the first quilt package nodule is in physical contact in an interdigitated manner with the second quilt package nodule; and
    each quilt package nodule includes a back supported by the corresponding microchip substrate and one or more fingers that extend away from said back and away from the corresponding edge surface of the microchip substrate.

9. The quilt packaging system of claim 8, wherein the angle is acute, obtuse, or right.

* * * * *